United States Patent
Nguyen et al.

(10) Patent No.: US 6,207,966 B1
(45) Date of Patent: Mar. 27, 2001

(54) MARK PROTECTION WITH TRANSPARENT FILM

(75) Inventors: Khanh B. Nguyen, San Mateo; Harry Levinson, Saratoga, both of CA (US); Richard D. Edwards; Stuart Brown, both of Austin, TX (US); Paul W. Ackmann, Buda, TX (US)

(73) Assignee: Advanced Micro Devices, Inc, Sunnyvale, CA (US)

( * ) Notice: Subject to any disclaimer, the term of this patent is extended or adjusted under 35 U.S.C. 154(b) by 0 days.

(21) Appl. No.: 09/205,010

(22) Filed: Dec. 4, 1998

(51) Int. Cl.[7] .............................. G01B 11/00; H01L 21/70
(52) U.S. Cl. ......................... 250/548; 356/399; 438/401
(58) Field of Search ................................. 250/548, 216, 250/557; 356/399, 400, 401; 438/401, 462; 257/797

(56) References Cited

U.S. PATENT DOCUMENTS

| | | |
|---|---|---|
| 4,487,653 | 12/1984 | Hatcher . |
| 4,595,295 | 6/1986 | Wilczynski . |
| 4,712,016 | 12/1987 | Matsumura . |
| 5,128,283 | 7/1992 | Tanaka . |
| 5,407,763 | 4/1995 | Pai . |
| 5,570,405 | 10/1996 | Chan et al. . |
| 5,738,961 | 4/1998 | Chen . |
| 5,801,090 | 9/1998 | Wu et al. . |
| 5,824,441 | 10/1998 | Farrow et al. . |
| 6,057,206 | * 5/2000 | Nguyen et al. ..................... 438/401 |

OTHER PUBLICATIONS

"Lithography II: Optical Aligners and Photomasks", Silicon Processing for the VLSI Era, pp. 459–489.
"Marks for alignment and registration in projection electron lithography", J. Vac. Sci. Technol. B 11(6), Nov./Dec. 1993, 1993 American Vacuum Society, pp. 2175–2178.

* cited by examiner

Primary Examiner—John R. Lee
Assistant Examiner—Kevin Pyo
(74) Attorney, Agent, or Firm—Eschweiler & Associates, LLC (57) ABSTRACT

An alignment mark protection structure (95) is disclosed which is used to ensure an integrity of an alignment scheme for a substrate (50) which is to be subjected to lithographic processing. The alignment mark protection structure (95) comprises the substrate (50) and an alignment mark (52) associated with the substrate (50). The alignment mark (52) reflects an alignment light (208) which is then used to determine an optimum alignment between the substrate (50) and a lithographic mask (214). A cap (100) overlies the alignment mark (52) and is substantially transparent with respect to the alignment light (208). The cap (100) protects the underlying alignment mark (52) from lithographic process-induced damage during processing and thus reduces alignment light noise, thereby improving the alignment between a mask (214) and the substrate (50) and minimizing the registration error associated with overlying layers formed on the substrate (50).

29 Claims, 7 Drawing Sheets

(PRIOR ART)

FIGURE 4c

(PRIOR ART)

MARK PROTECTION WITH TRANSPARENT FILM

FIELD OF THE INVENTION

The present invention generally relates to lithography and more particularly relates to a structure for protecting alignment marks on a substrate. The protection structure protects the integrity of the alignments marks during various forms of processing, thus enabling alignment to be maintained throughout processing, and minimizing registration errors.

BACKGROUND OF THE INVENTION

In the semiconductor industry, there is a continuing trend toward higher device densities. To achieve these high densities there has been, and continues to be, efforts toward scaling down the device dimensions on semiconductor wafers. In order to accomplish such a high device packing density, smaller features sizes are required. This may include the width and spacing of interconnecting lines and the surface geometry such as the corners and edges of various features.

The requirement of small features with close spacing between adjacent features requires high resolution photolithographic processes. In general, lithography refers to processes for pattern transfer between various media. It is a technique used for integrated circuit fabrication in which, for example, a silicon wafer is coated uniformly with a radiation-sensitive film (e.g., a photoresist), and an exposing source (such as ultraviolet light, x-rays, or an electron beam) illuminates selected areas of the film surface through an intervening master template (e.g., a mask or reticle) to generate a particular pattern. The exposed pattern on the photoresist film is then developed with a solvent called a developer which makes the exposed pattern either soluble or insoluble depending on the type of photoresist (i.e., positive or negative resist). The soluble portions of the resist are then removed, thus leaving a photoresist mask corresponding to the desired pattern on the silicon wafer for further processing.

Clearly, projection lithography is a powerful and important tool for integrated circuit processing. However, in order to further increase the packing density of integrated circuits, not only is the quality of lithographic imaging important, but the accuracy with which an image can be positioned on the surface of a substrate is also of considerable importance. Because integrated circuits are fabricated by patterning a plurality of layers in a particular sequence to generate features that require a particular spatial relationship with respect to one another, each layer must be properly aligned with respect to previously patterned layers to minimize the size of individual devices and thus maximize the packing density on the substrate. Presently, having a perfect overlap (i.e., zero registration error) is not easily achievable. Consequently, a registration or overlay tolerance is required between two layers to ensure reliability in the construction of the resulting device. This registration or overlay tolerance undesirably increases the size of various structures and therefore attempts are made to minimize the tolerance.

As is evident from the discussion above, it is desirable to minimize the registration tolerance needed to form overlying patterns in order to improve the packing density of structures which form the integrated circuit. One solution which has been used to maximize the pattern overlay accuracy of various layers is to form one or more alignment marks or patterns on the underlying substrate and each mask. When the alignment marks or patterns on the substrate and mask are optically aligned, for example, then the remainder of the circuit patterns are assumed to be aligned.

Figure 1:
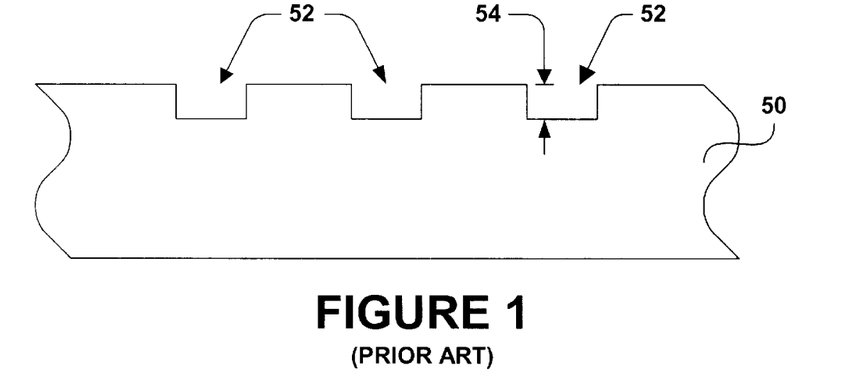
FIG. 1 is a prior art fragmentary cross section of a substrate having a plurality of alignment marks therein.

Another type of alignment system uses an alignment mark scheme as illustrated in prior art FIG. 1, which illustrates a fragmentary cross section of a substrate such as a silicon wafer. A substrate 50 has one or more recesses 52 formed therein which serve as alignment marks. Each recess preferably has a depth 54 which is a function of the alignment radiation wavelength (e.g., a depth of $\lambda/4$). The predetermined depth 54 provides a destructive interference phenomena upon the reflection off the marks 52 which allows the alignment marks 52 to be more effectively "seen" (i.e., they exhibit a better reflective contrast than the neighboring non-recessed regions and are thus more visible).

An exemplary prior art alignment system 58 uses the alignment marks 52 of prior art FIG. 1 in the following manner, as illustrated in prior art FIG. 2. An alignment light source (not shown) illuminates a grating of alignment marks 52 with radiation 60 which has its diffracted orders reflect off the alignment marks 52 and get captured by a lens 62 and directed toward a mask 64. The reflected radiation 60 is used as a signal to detect the alignment between the mask 64 and the substrate 50.

As will become apparent in the discussion that follows, the prior art alignment mark structure suffers from some disadvantages which prevents alignment accuracy from being maximized. There is thus a need in the art for improved alignment structures and systems.

SUMMARY OF THE INVENTION

The present invention relates to an alignment mark protection structure which protects an alignment mark from process-induced damage. Consequently, the integrity of the alignment mark is preserved throughout a range of processing steps, thereby maintaining optimal alignment between a mask and the substrate throughout processing and thus minimizing registration error among various layers formed during such processing.

According to one aspect of the present invention, the alignment mark protection structure includes an alignment mark associated with a substrate on which and/or within which processing is to occur. A cap is formed over the alignment mark to thereby protect the alignment mark during various forms of processing such as etching, stripping, cleaning, polishing, etc. The cap is substantially transparent with respect to an alignment light and therefore does not impact the alignment accuracy of the alignment mark over the prior art. Instead, the alignment mark protection structure of the present invention improves the alignment accuracy over prior art alignment schemes by preventing the formation of foreign matter within the alignment mark during processing, thus eliminating the denigration in alignment due to noise within the reflected alignment light.

According to another aspect of the present invention, the alignment mark is formed in a non-active region of the substrate. The alignment mark preferably constitutes a recess having a rectangular cross section with a depth that is about one-quarter of the wavelength of the alignment light ($\lambda/4$) in order to maximize the reflection contrast of the alignment light at the alignment mark with respect to the surrounding region, thus allowing the mark to be more easily "seen". Alternatively, the alignment mark may constitute a projection having a rectangular cross section with a height that is a function of the alignment wavelength (e.g., $\lambda/4$) for optimal contrast. In addition, the cap may comprise one or more layers which are substantially transparent with respect to the alignment light. During processing, an exposed surface of the cap may receive process-induced damage. However, such damage on the surface of the cap is typically of a random nature and thus can be filtered; consequently such damage on the cap does not impact the alignment accuracy. Consequently, the cap prevents the formation of foreign matter within or on the alignment mark during processing and provides for an accurate alignment scheme throughout multiple processing steps.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 2:
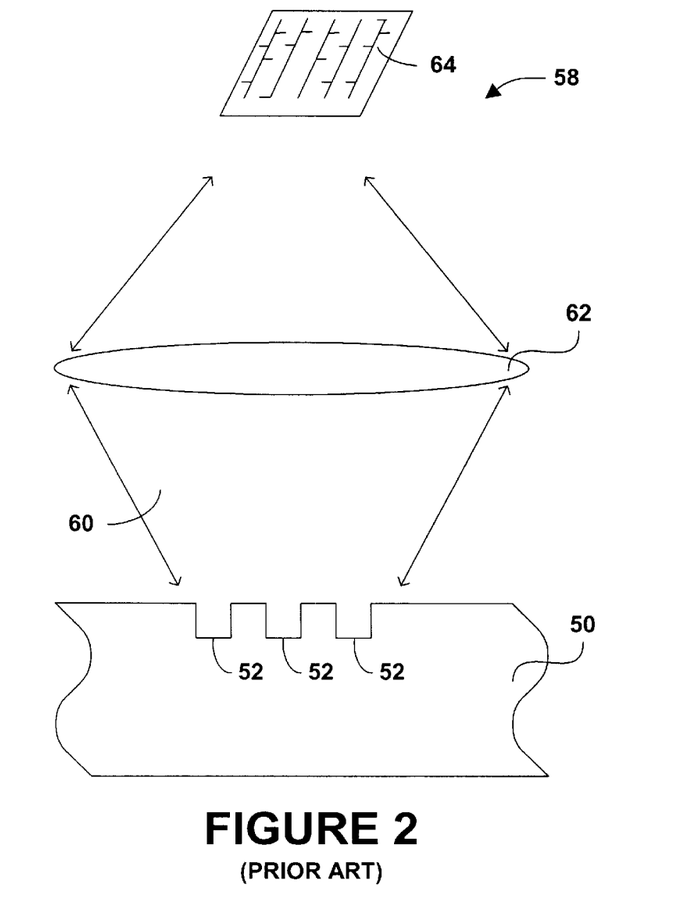
FIG. 2 is a prior art cross section diagram illustrating an alignment system in an ideal situation, wherein no matter exists within an alignment mark, and how the alignment system uses an alignment light in conjunction with an alignment mark in the substrate to align the substrate with a mask for processing.

In prior art alignment systems such as those illustrated in prior art FIGS. 1 and 2 having traditional alignment mark structures 52, several drawbacks exist which result in a degradation in alignment accuracy.

Figure 3:
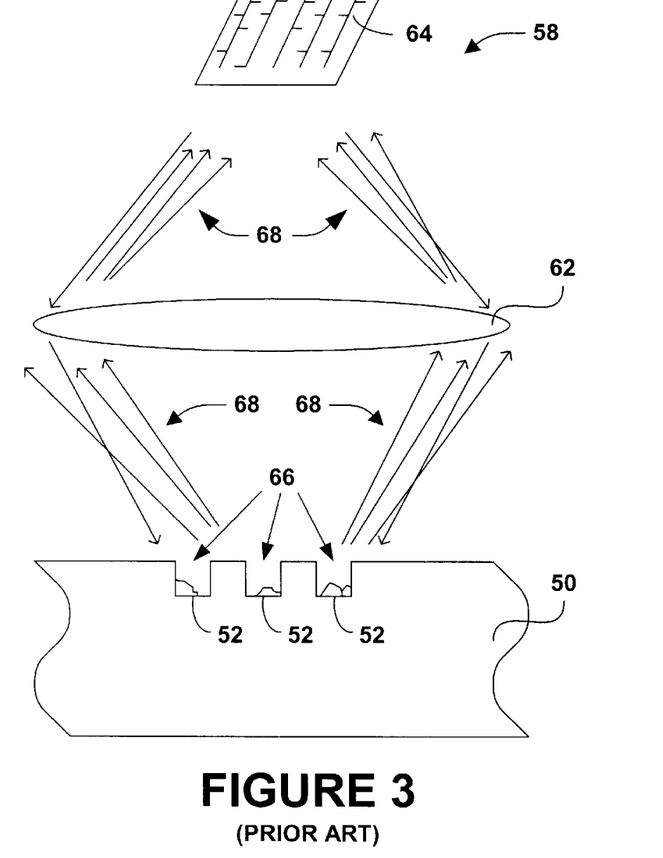
FIG. 3 is a prior art cross section diagram illustrating the alignment system of FIG. 2 in the absence of ideal conditions, wherein foreign matter resides in the alignment mark due to one or more processing steps, and how the existence of such foreign matter contributes to alignment error within the alignment system.

For example, if foreign matter 66 resides within one or more of the alignment marks 52, as illustrated in prior art FIG. 3, the alignment light radiation 68 which reflects off of the alignment marks 52 contains noise due to the foreign matter 66 within the alignment marks 52 and results in a significant amount of noise in the reflected diffracted orders. This noise is captured by the lens 62 and imaged back toward the mask 64 and the noisy image causes the alignment accuracy to diminish substantially.

Figure 4A:
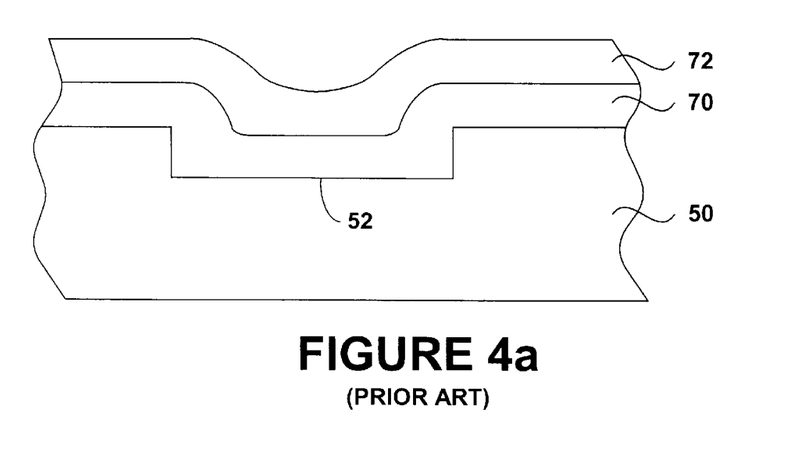
FIGS. 4a–4c are prior art fragmentary cross section diagrams illustrating how a series of processing steps may cause the formation of foreign matter within an alignment mark.
Figure 4B:
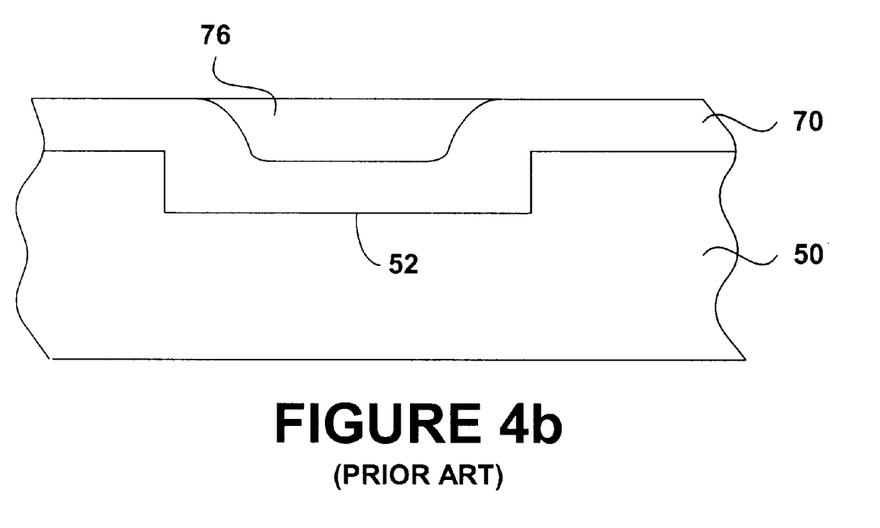
Figure 4C:
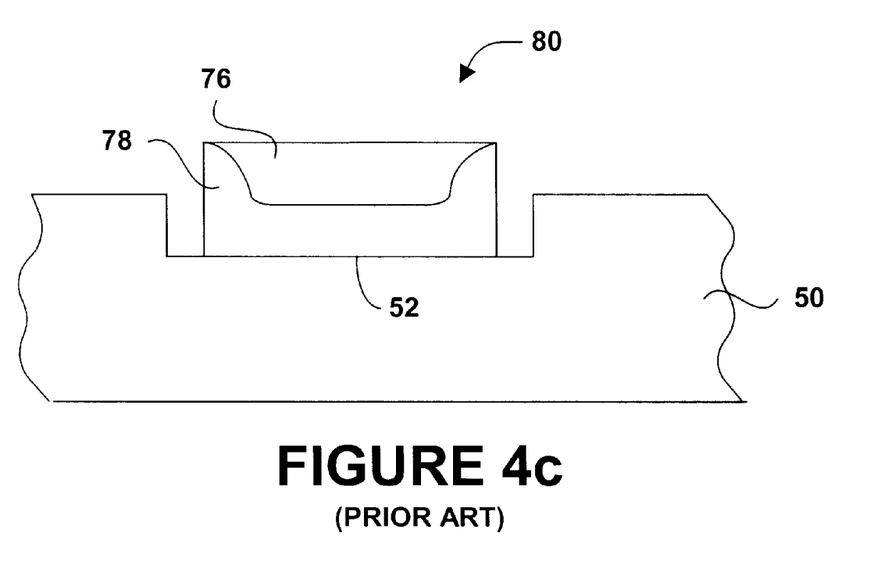

Foreign matter 66, such as that illustrated in prior art FIG. 3, can form within the alignment marks 52 in a variety of ways. For example, as illustrated in prior art FIGS. 4a–4c, a series of deposition and processing steps may result in matter undesirably being left in one or more of the alignment marks 52. As illustrated in prior art FIG. 4a, the semiconductor process may dictate the formation of a blanket nitride film deposition followed by an oxide film formation, thus forming films 70 and 72, respectively. Due to the conformal nature of the film layers 70 and 72, if a subsequent chemical-mechanical polish (CMP) step or other type film removal process is performed to remove the oxide film 72 in the region local to the alignment marks 52, as illustrated in prior art FIG. 4b, a portion 76 of the oxide film 72 may remain over the one or more alignment marks 52. If the nitride film 70 is then stripped away in the region local to the alignment marks 52 in order to enable the alignment system 58 to "see" the alignment marks 52 for a subsequent mask step, the oxide film portion 76 masks a portion 78 of the nitride film 70 within the one or more alignment marks 52, thus undesirably resulting in a residual hillock-type structure 80 therein, as illustrated in prior art FIG. 4c. Therefore when the alignment system 58 transmits the alignment light radiation onto the alignment marks 52, noise is produced by the hillock 80 and exists within the reflected light radiation. Consequently, this modifies the apparent position of the alignment marks seen by the alignment system which consequently results in a degradation in alignment accuracy and a corresponding increase in pattern registration error.

Figure 5A:
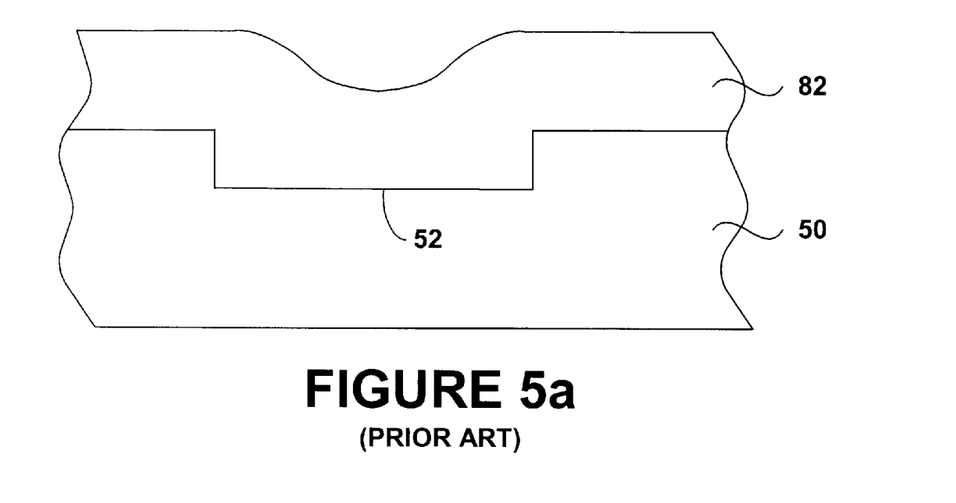
FIGS. 5a–5b are prior art fragmentary cross section diagrams illustrating how another series of processing steps may cause the formation of foreign matter within an alignment mark.
Figure 5B:
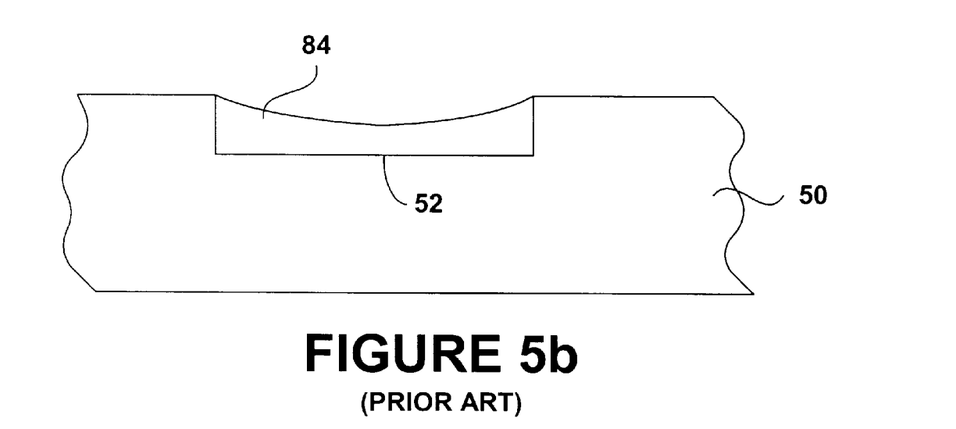

Likewise, other types of nonuniform depositions or formations within the alignment marks 52 can cause similar degradation in registration accuracy. For example, as illustrated in prior art FIGS. 5a and 5b, if a film such as an oxide film 82 is deposited or otherwise formed over the substrate 50, as illustrated in prior art FIG. 5a, and then polished back, a portion 84 of the oxide film 82 is not flush with the substrate 50 as would be expected in an ideal process, but rather is gouged slightly to form an asymmetric structure 82 within the alignment marks 52. In addition, the asymmetric shape of the remaining oxide portion 84 is not uniform, repeatable or substantially controllable. Such mark variations undesirably result in a degradation in alignment accuracy.

The following is a detailed description of the present invention made in conjunction with the attached Figures, wherein like reference numerals will refer to like elements throughout. The present invention includes an alignment protection structure and an associated alignment system which protects one or more alignment marks from process-induced damage, thus ensuring alignment accuracy for multiple process steps and thereby minimizing registration error between various layers in one or more structures being fabricated.

The alignment mark protection structure includes a cap overlying the one or more alignment marks. The cap is substantially transparent with respect to a wavelength of an alignment light used in the alignment process. Consequently, the one or more underlying alignment marks can be seen by an alignment system through the cap. The cap protects the one or more alignment marks by preventing foreign matter from being formed therein and thus eliminates errors associated with such matter during multiple processing steps. In addition, although the cap itself endures damage on its exposed surfaces due to the various processing steps (e.g., pock marks, scratches, rounded edges, etc.), such cap defects are out of focus with respect to the alignment system and thus do not substantially impact the alignment accuracy. Using the alignment mark protection structure of the present invention, alignment error due to process-induced damage associated with the one or more alignment marks is eliminated, thus maintaining high alignment accuracy through an entire process flow. Consequently, registration errors for overlying layers may be minimized, thus increasing the packing density for multiple devices on the substrate.

Figure 6A:
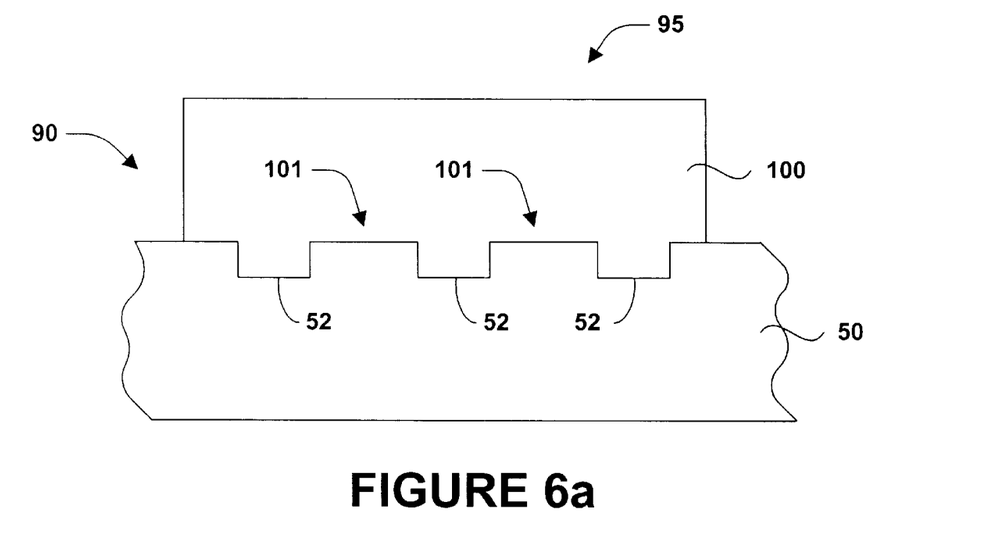
FIG. 6a is a fragmentary cross section diagram illustrating an alignment mark protection structure including a cap overlying a plurality of alignment marks according to the present invention.

Referring now to the Figures, FIG. 6a is a fragmentary cross section diagram illustrating a portion 90 of the substrate 50 having an alignment mark protection structure 95. The portion 90 of the substrate 50 includes a plurality of alignment marks 52 therein, similar to the alignment marks 52 of prior art FIG. 1. The alignment mark protection structure 95 includes a cap 100 which overlies the alignment marks 52. The cap 100 serves to protect the alignment marks during subsequent processing of the substrate 50. Consequently, the integrity of the alignment marks 52 is maintained throughout the entire process flow (e.g., a standard CMOS flow, a flash memory process flow, etc.) which allows for high alignment accuracy to be maintained for each step in the process.

The cap 100 is formed of a material which is substantially transparent with respect to an alignment light utilized in the alignment process. For example, for an alignment light source having a wavelength of 6,328 Angstroms (i.e., about 632 nn), materials such as silicon dioxide ($SiO_2$) or silicon nitride ($Si_3N_4$) may be used. Alternatively, however, other materials which are substantially transparent with respect to the alignment light may be used and such materials are contemplated as falling within the scope of the present invention. In the above manner, the alignment marks 52 may still be sufficiently "seen" by the alignment system despite the presence of the cap 100.

Preferably, the cap 100 exhibits an alignment light absorption of about 50 percent or less and more preferably an absorption of about 25 percent or less. Note that the absorption sufficiency of the cap 100 is difficult to characterize because the acceptable cap absorption (i.e., substantially transparent) is a function of the quality of the alignment system. Typically, the absorption of the cap 100 needs to have a signal-to-noise ratio which is sufficient to let the alignment system operate repeatably. Such desired repeatability may be obtained if the return signal (the diffracted orders) is 5% of what would be reflected if the alignment light had reflected off of a silicon surface. Therefore the thickness of the cap 100 is preferably selected to provide a sufficient transparency with respect to the alignment light while simultaneously being sufficiently thick to adequately protect the alignment marks 52 throughout the entire process flow. For example, the cap 100 is preferably $SiO_2$ having a thickness of about 2,000 Angstroms, but may vary substantially, for example, between about 1,000 Angstroms and about 50,000 Angstroms. At this thickness, the cap 100 exhibits an absorption of about 10% and is thus substantially transparent.

As discussed above, the alignment marks 52 of FIG. 6a exhibit recesses within the substrate 50. According to a preferred embodiment of the present invention, the recesses have a rectangular cross section having a depth which provides an optical contrast with its neighboring regions 101 (e.g., a depth of $\lambda/4$, wherein the $\lambda$ is the wavelength of the alignment light). Alternatively, however, the alignment marks can be constructed in a variety of different cross sectional shapes and any such modification is contemplated as falling within the scope of the present invention.

Preferably, the portion 90 of the substrate 50 containing the alignment marks 52 is located in a non-active portion of the substrate 50, that is, a portion not containing active devices such as transistors, capacitors, resistors, etc. For example, such a region 90 may exist within a scribe line between various die on a semiconductor wafer. Consequently, the alignment mark protection structure 95 does not adversely effect the die size of the device being fabricated. Alternatively, however, the alignment mark protection structure 95 of the present invention may be located at any location of the substrate and may exist for each die on the substrate or only a single such structure 95 may exist on the entire substrate 50, as may be desired. In addition, although FIG. 6a illustrates a plurality of alignment marks 52, the present invention may also be applied to a single alignment mark.

Figure 6B:
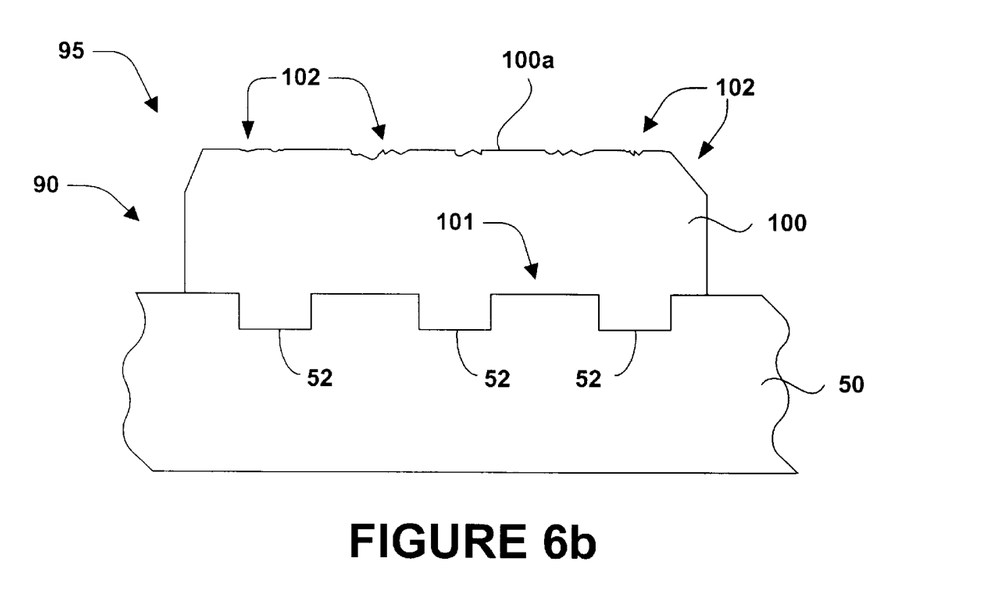
FIG. 6b is a fragmentary cross section diagram illustrating the alignment mark protection structure of FIG. 6a, wherein the cap includes a plurality of damage sites due to process-induced damage.

During execution of the process flow, various layers are blanket deposited and patterned, stripped, polished, etc. over the surface of the substrate 50 and thus interact with the alignment mark protection structure 95. For example, conductive layers, photoresist layers, etc. are deposited, patterned, stripped or polished to effectuate the formation of the desired structures on and in the substrate 50. Such processing steps result in a substantial amount of damage or defects 102 on a surface 100a of the cap 100, as illustrated in FIG. 6b. Such defects 102 may include pock marks, scratches, rounding of the edges, thinning of the cap 100, etc. The defects 102, however, are a substantial distance away from the alignment marks 52 (i.e., about a distance equal to the thickness of the cap 100) and are of a random nature and thus can be easily filtered out of the reflected diffracted orders. Consequently, the cap 100 of the present invention, even though it endures process-induced damage 102, the cap 100 protects the alignment marks 52 and allows the marks 52 to be clearly seen by the alignment system despite the presence of defects 102 on its exposed surface 100a.

Figure 7:
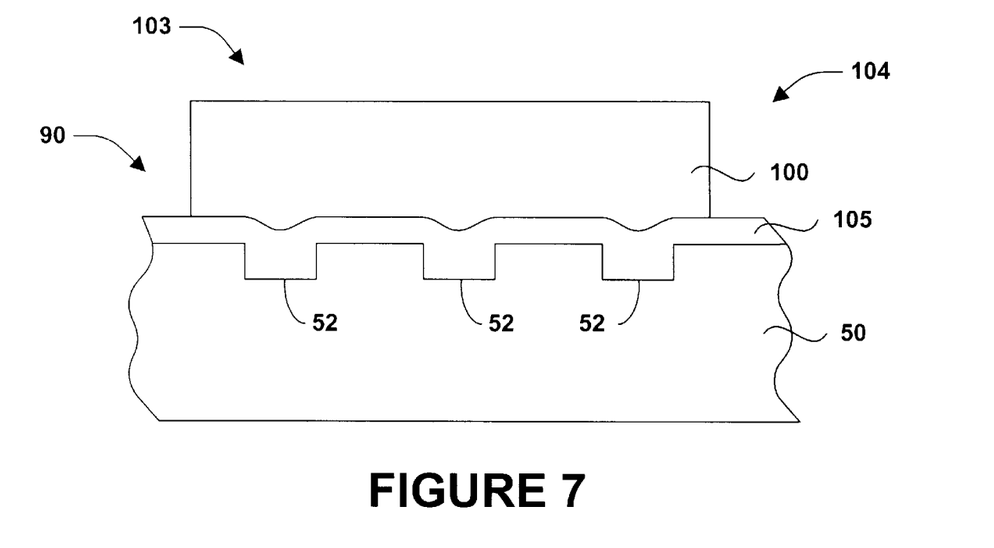
FIG. 7 is a fragmentary cross section diagram illustrating an alternative alignment mark protection structure according to the present invention.

An alternative embodiment of the present invention is illustrated in FIG. 7. As illustrated in FIG. 7, an alignment mark protection structure 103 is formed in the portion 90 of the substrate 50, and includes a multilayer cap 104, having the top cap portion 100 overlying an interface layer 105. The multilayer cap 104, similar to the cap 100 of FIG. 6a, is substantially transparent with respect to the alignment light. The cap 104 is a multilayer structure in accordance with a process flow which is typical in many CMOS process flows. The interface layer 105 is, for example, a silicon nitride layer 105 having a thickness of about 1,500 Angstroms and is formed as a part of a CMOS isolation process. Although the interface layer 105 may be removed, since the layer 105 is substantially transparent, the protection structure 103 may simply utilize the interface layer 105 as a portion of the cap 104.

Figure 8:
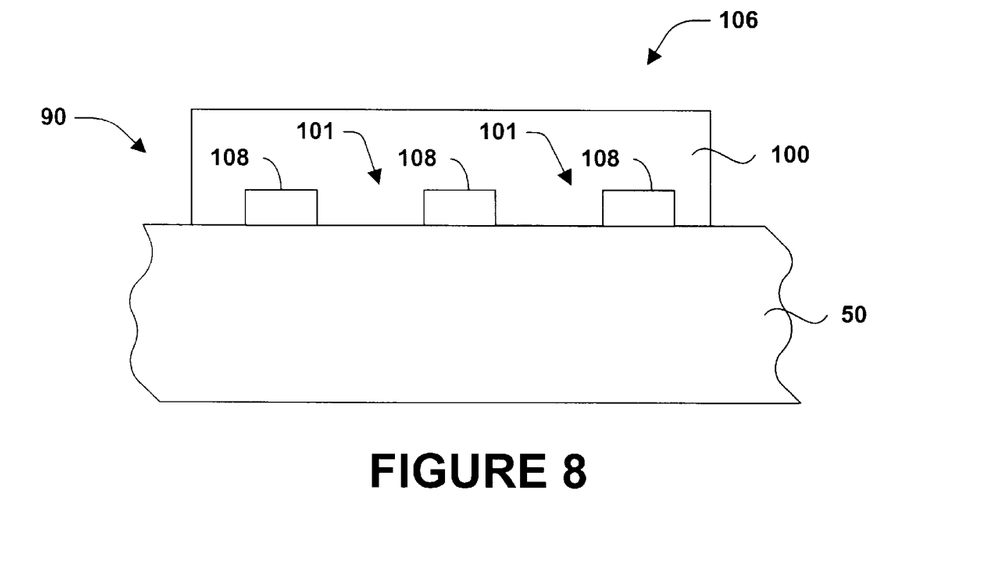
FIG. 8 is a fragmentary cross section diagram illustrating another alternative alignment mark protection structure according to the present invention.

According to another alternative embodiment of the present invention, another alignment mark scheme may be protected similarly with an alignment mark protection structure 106, as illustrated in FIG. 8. As illustrated in FIG. 8, the portion 90 of the substrate 50 contains a plurality of alignment marks 108 which project above the substrate 50. Such marks 108 may consist of various materials (e.g., polysilicon, etc.) and preferably have a height which is a function of the wavelength of the alignment light (e.g., $\lambda/4$) in order to maximize the optical contrast with the neighboring areas 101. The cap 100 overlies the alignment marks 108 and protects them in a manner similar to that described above in conjunction with FIGS. 6a and 6b. Preferably, the projection-type alignment marks 108 have a rectangular cross section, however, other shaped projections alternatively may be employed and are contemplated as falling within the scope of the present invention.

Figure 9:
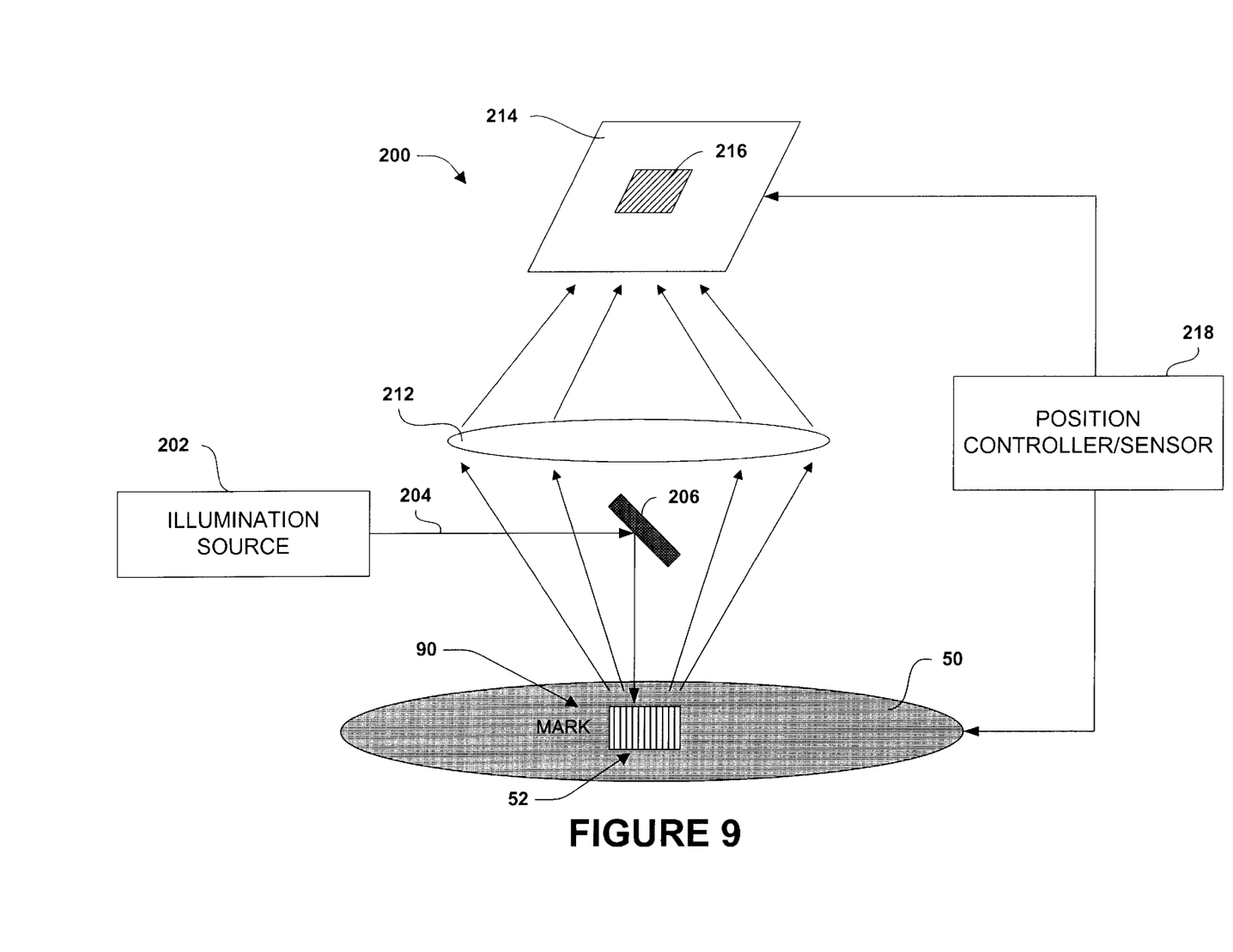
FIG. 9 is a cross section diagram illustrating an exemplary alignment system using the alignment mark protection structure according to the present invention.

The alignment mark protection structure of the present invention is preferably employed within an alignment system 200, as illustrated in FIG. 9. The system 200 includes an alignment light source 202, such as a laser, etc., which directs alignment light 204 toward the substrate 50 using an imaging system (e.g., a mirror 206). The light 204 is directed toward the portion 90 of the substrate 50 containing the alignment marks 52. The substrate 50 includes the alignment mark protection structure 95 (not shown since the structure 95 is substantially transparent with respect to the alignment light) which eliminates the introduction of foreign matter within the one or more alignment marks 52. Consequently, noise in the reflected alignment light (the diffracted orders) which is associated with such foreign matter is eliminated and the reflected alignment light is captured by the lens 212 and imaged back toward a mask 214 which includes a grating 216 which matches the grating of the alignment marks 52. A position controller/sensor 218 (e.g., a motor or computer controlled stage, other conventional masks and substrate positioning mechanisms, etc.) is coupled to the substrate 50 and the mask 214 and uses the reflected diffracted orders as a signal. In addition, the controller/sensor 218 moves the mask 214 and/or the substrate 50 with respect to one another in response to the reflected signal to effectuate an accurate alignment. Although the alignment mark protection structure of the present invention has been described in conjunction with the alignment system 200 in FIG. 9, the present invention is also applicable to other type alignment systems and such systems are contemplated as falling within the scope of the present invention.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An alignment mark protection structure for ensuring an integrity of an alignment scheme for a substrate which is to be subjected to lithographic processing, comprising:

the substrate;

a plurality of alignment marks associated with the substrate, wherein the alignment marks reflect diffracted orders of an alignment light for determining an optimum alignment between the substrate and a lithographic mask; and a cap overlying the alignment marks, wherein the cap is substantially transparent with respect to the alignment light and protects the underlying alignment marks from lithographic process-induced damage.

2. The alignment mark protection structure of claim 1, wherein an absorption of the substantially transparent cap is less than about 50%.

3. The alignment mark protection structure of claim 1, wherein the cap is a film having a thickness of about 1,000 Angstroms to about 50,000 Angstroms.

4. The alignment mark protection structure of claim 1, wherein the cap comprises silicon dioxide.

5. The alignment mark protection structure of claim 1, wherein the cap comprises silicon nitride.

6. The alignment mark protection structure of claim 1, wherein the alignment marks comprise a plurality of recesses in a top surface of the substrate.

7. The alignment mark protection structure of claim 6, wherein the recesses have a rectangular cross section.

8. The alignment mark protection structure of claim 6, wherein the recesses have a depth which is a function of an alignment wavelength of the alignment light.

9. The alignment mark protection structure of claim 8, wherein the depth is one-quarter of the wavelength of the alignment light.

10. The alignment mark protection structure of claim 1, wherein the alignment marks comprise a plurality of projections on a top surface of the substrate.

11. The alignment mark protection structure of claim 10, wherein the projections have a rectangular cross section.

12. The alignment mark protection structure of claim 10, wherein the projections have a height which is a function of an alignment wavelength of the alignment light.

13. The alignment mark protection structure of claim 12, wherein the height is one-quarter of the wavelength of the alignment light.

14. The alignment mark protection structure of claim 1, wherein the substrate comprises a material including one of silicon, germanium, gallium arsenide, glass or sapphire.

15. The alignment mark protection structure of claim 1, wherein the cap comprises a plurality of substantially transparent layers.

16. An alignment system for aligning a substrate and a mask for lithographic processing to thereby minimize registration error between layers of a process structure residing on the substrate, comprising:

a light source for generating an alignment light;

a lens located within an optical path of the alignment light, wherein the lens captures diffracted orders of the alignment light which has reflected off of a portion of the substrate and focuses the reflected alignment light upon a grating structure on the mask;

a plurality of alignment marks at the portion of the substrate;

a cap overlying the alignment marks on the substrate, wherein the cap is substantially transparent with respect to the alignment light and protects an integrity of the alignment marks from process-induced damage and substantially prevents a generation of noise in the reflected alignment light; and means for moving the substrate and mask with respect to one another and means for detecting the reflected alignment light, wherein the means for moving adjusts a relative positioning between the mask and the substrate in response to the detected reflected alignment light, thereby establishing an alignment between the mask and the substrate.

17. The alignment system of claim 16, wherein an absorption of the substantially transparent cap is less than about 50%.

18. The alignment system of claim 16, wherein the cap is a film having a thickness of about 1,000 Angstroms to about 50,000 Angstroms.

19. The alignment system of claim 16, wherein the cap comprises silicon dioxide.

20. The alignment system of claim 16, wherein the cap comprises silicon nitride.

21. The alignment system of claim 16, wherein the alignment marks comprise a plurality of recesses in a top surface of the substrate.

22. The alignment system of claim 21, wherein the recesses have a rectangular cross section.

23. The alignment system of claim 21, wherein the recesses have a depth which is a function of an alignment wavelength of the alignment light.

24. The alignment system of claim 23, wherein the depth is one-quarter of the wavelength of the alignment light.

25. The alignment system of claim 16, wherein the alignment marks comprise a plurality of projections on a top surface of the substrate.

26. The alignment system of claim 25, wherein the projections have a rectangular cross section.

27. The alignment system of claim 25, wherein the projections have a height which is a function of an alignment wavelength of the alignment light.

28. The alignment system of claim 27, wherein the height is one-quarter of the wavelength of the alignment light.

29. The alignment system of claim 16, wherein the cap comprises a plurality of substantially transparent layers.

* * * * *

UNITED STATES PATENT AND TRADEMARK OFFICE
CERTIFICATE OF CORRECTION

PATENT NO. : 6,207,966 B1
DATED : March 27, 2001
INVENTOR(S) : Khanh B. Nguyen, Harry Levinson, Richard D. Edwards, Stuart Brown, Paul W. Ackmann It is certified that error appears in the above-identified patent and that said Letters Patent is hereby corrected as shown below:

Column 1,
Line 21, please replace the word "comers" with the word -- corners --.

Signed and Sealed this

Sixth Day of November, 2001

*Attest:*

Nicholas P. Godici

NICHOLAS P. GODICI
*Attesting Officer*     *Acting Director of the United States Patent and Trademark Office*